US009217582B2

(12) United States Patent
Frazier et al.

(10) Patent No.: US 9,217,582 B2
(45) Date of Patent: Dec. 22, 2015

(54) SOLAR ENERGY CONVERSION (75) Inventors: Scott Frazier, Golden, CO (US); Rik Deaton, Wanaka (NZ)

(73) Assignee: MBC VENTURES, INC., Baltimore, MD (US)

( * ) Notice: Subject to any disclaimer, the term of this patent is extended or adjusted under 35 U.S.C. 154(b) by 831 days.

(21) Appl. No.: 13/056,487

(22) PCT Filed: Aug. 6, 2009

(86) PCT No.: PCT/US2009/053054
§ 371 (c)(1),
(2), (4) Date: May 12, 2011

(87) PCT Pub. No.: WO2010/017422
PCT Pub. Date: Feb. 11, 2010

(65) Prior Publication Data
US 2011/0214712 A1    Sep. 8, 2011

Related U.S. Application Data

(60) Provisional application No. 61/086,618, filed on Aug. 6, 2008.

(51) Int. Cl.
*H01L 31/042* (2014.01)
*H01L 31/00* (2006.01)
(Continued)

(52) U.S. Cl.
CPC .... *F24J 2/10* (2013.01); *F24J 2/14* (2013.01); *F24J 2/265* (2013.01); *F24J 2/5403* (2013.01);
(Continued)

(58) Field of Classification Search
CPC .................................................. H01L 31/0547
USPC .......................................... 136/248, 246, 259
See application file for complete search history.

(56) References Cited

U.S. PATENT DOCUMENTS

| 2,288,465 A | 6/1942 | Knudsen |
| 2,595,905 A | 5/1952 | Telkes |

(Continued)

FOREIGN PATENT DOCUMENTS

| CN | 2443297 Y | 8/2001 |
| EP | 0371000 | 5/1990 |

(Continued)

OTHER PUBLICATIONS

Office Action issued by Japanese Patent Office on Oct. 1, 2013 in corresponding Japanese Application No. 2011-522255.

(Continued)

*Primary Examiner* — Jeffrey T Barton
*Assistant Examiner* — Uyen Tran
(74) *Attorney, Agent, or Firm* — Whiteford, Taylor & Preston, LLP; Gregory M. Stone (57) ABSTRACT

Methods, apparatus, and systems relating to the use and design of specially shaped, rotating reflective louvers to provide cost effectively harvesting of electricity, heat, and/or lighting are described. In an embodiment, the reflected and concentrated direct light is focused on the neighboring louver photovoltaic cells to generate electricity and an integral cooling channel allows heat collection. A skylight embodiment permits the indirect light to pass between the louvers and through a transparent backing providing high quality natural light inside while allowing artificial lights to be dimmed or turned off saving energy. In some embodiments, control systems (that may be computer controlled) can modulate the louver position to improve the light transmitted into the building when appropriate to maximize the net energy saved or generated depending on the situation. Moreover, the devices can be retrofitted into existing buildings or integrated into new building construction. Other embodiments are also disclosed.

19 Claims, 6 Drawing Sheets

(51) Int. Cl.
| | |
|---|---|
| *F24J 2/10* | (2006.01) |
| *F24J 2/14* | (2006.01) |
| *F24J 2/26* | (2006.01) |
| *F24J 2/54* | (2006.01) |
| *H02S 30/20* | (2014.01) |
| *H02S 40/44* | (2014.01) |
| *H01L 31/054* | (2014.01) |
| *F24J 2/04* | (2006.01) |

(52) U.S. Cl.
CPC ............ *H01L 31/0547* (2013.01); *H02S 30/20* (2013.01); *H02S 40/44* (2013.01); *F24J 2002/0411* (2013.01); *F24J 2002/5468* (2013.01); *Y02B 10/10* (2013.01); *Y02B 10/20* (2013.01); *Y02B 10/70* (2013.01); *Y02E 10/44* (2013.01); *Y02E 10/45* (2013.01); *Y02E 10/47* (2013.01); *Y02E 10/52* (2013.01); *Y02E 10/60* (2013.01)

(56) References Cited

U.S. PATENT DOCUMENTS

| | | | | |
|---|---|---|---|---|
| 2,651,085 | A | | 9/1953 | Kopp |
| 3,077,643 | A | | 2/1963 | Homer |
| 3,437,818 | A | | 4/1969 | Shattuck |
| 3,832,853 | A | | 9/1974 | Butler, Jr. |
| 3,981,445 | A | | 9/1976 | Custer |
| 3,982,527 | A | | 9/1976 | Cheng et al. |
| 4,026,269 | A | | 5/1977 | Stelzer |
| 4,034,736 | A | | 7/1977 | Telkes |
| 4,106,483 | A | | 8/1978 | Barber, Jr. |
| 4,127,105 | A | | 11/1978 | Watt |
| 4,137,098 | A | | 1/1979 | Field |
| 4,143,640 | A | | 3/1979 | Pierce |
| 4,153,038 | A | * | 5/1979 | McDonald .................... 126/579 |
| 4,153,474 | A | | 5/1979 | Rex |
| 4,159,707 | A | | 7/1979 | Miquel |
| 4,180,414 | A | | 12/1979 | Diamond et al. |
| 4,187,123 | A | * | 2/1980 | Diggs ........................... 136/206 |
| 4,220,137 | A | | 9/1980 | Tesch et al. |
| 4,279,240 | A | | 7/1981 | Artusy |
| 4,281,488 | A | | 8/1981 | Resibois |
| 4,301,787 | A | | 11/1981 | Rice |
| 4,308,857 | A | * | 1/1982 | Sims ............................ 126/652 |
| 4,321,416 | A | | 3/1982 | Tennant |
| 4,351,320 | A | | 9/1982 | Tetirick |
| 4,401,103 | A | | 8/1983 | Thompson |
| 4,410,757 | A | | 10/1983 | Stamminger et al. |
| 4,520,794 | A | | 6/1985 | Stark et al. |
| 4,567,316 | A | | 1/1986 | Hollaus et al. |
| 4,577,619 | A | | 3/1986 | Howe, Jr. |
| 4,598,694 | A | | 7/1986 | Cromer |
| 4,658,806 | A | | 4/1987 | Boozer |
| 4,690,355 | A | * | 9/1987 | Hornung et al. ........... 244/172.8 |
| 4,883,340 | A | | 11/1989 | Dominguez |
| 5,115,612 | A | | 5/1992 | Newton et al. |
| 5,128,181 | A | | 7/1992 | Kunert |
| 5,131,955 | A | | 7/1992 | Stern et al. |
| 5,180,441 | A | * | 1/1993 | Cornwall et al. ............ 136/246 |
| 5,221,363 | A | | 6/1993 | Gillard |
| 5,344,496 | A | | 9/1994 | Stern et al. |
| 5,413,161 | A | | 5/1995 | Corazzini |
| 5,500,052 | A | | 3/1996 | Horiuchi et al. |
| 5,851,309 | A | | 12/1998 | Kousa |
| 6,029,656 | A | | 2/2000 | Schwarz |
| 6,134,842 | A | | 10/2000 | Cheng et al. |
| 6,276,359 | B1 | | 8/2001 | Frazier |
| 6,294,725 | B1 | * | 9/2001 | Hirschberg et al. ........... 136/256 |
| 6,372,978 | B1 | | 4/2002 | Cifaldi |
| 6,528,782 | B1 | | 3/2003 | Zhang et al. |
| 6,971,756 | B2 | * | 12/2005 | Vasylyev et al. .............. 359/852 |
| 7,352,509 | B2 | | 4/2008 | Pagel |
| 7,617,857 | B2 | | 11/2009 | Froese |
| 8,156,685 | B2 | | 4/2012 | Kleinwaechter |
| 8,430,093 | B1 | | 4/2013 | Harris |
| 2003/0000567 | A1 | | 1/2003 | Lynn |
| 2003/0038610 | A1 | | 2/2003 | Munshi et al. |
| 2003/0168056 | A1 | | 9/2003 | Fidler |
| 2005/0109384 | A1 | * | 5/2005 | Shingleton et al. .......... 136/244 |
| 2005/0133086 | A1 | * | 6/2005 | Itoyama et al. ............... 136/256 |
| 2005/0161074 | A1 | * | 7/2005 | Garvison et al. ............. 136/246 |
| 2006/0288645 | A1 | | 12/2006 | Konstantino et al. ......... 49/92.1 |
| 2007/0034247 | A1 | | 2/2007 | Takada et al. |
| 2007/0056579 | A1 | | 3/2007 | Straka |
| 2007/0235021 | A1 | | 10/2007 | Reed et al. |
| 2008/0029149 | A1 | * | 2/2008 | Simon ........................... 136/246 |
| 2008/0210293 | A1 | | 9/2008 | Reid et al. |
| 2008/0250735 | A1 | | 10/2008 | Patterson |
| 2009/0000613 | A1 | | 1/2009 | Edwards et al. |
| 2009/0165841 | A1 | * | 7/2009 | Gunn et al. ................... 136/245 |
| 2009/0173375 | A1 | | 7/2009 | Frazier et al. |
| 2009/0255567 | A1 | | 10/2009 | Frolov et al. |
| 2009/0288705 | A1 | | 11/2009 | Hiwatashi et al. |
| 2009/0320388 | A1 | | 12/2009 | Lilli et al. |
| 2010/0020630 | A1 | | 1/2010 | Musil |
| 2010/0079387 | A1 | | 4/2010 | Rosenblatt et al. |
| 2010/0147353 | A1 | | 6/2010 | Kamath |
| 2010/0149643 | A1 | | 6/2010 | Hooper, Jr. |
| 2011/0120524 | A1 | | 5/2011 | Wares et al. |
| 2011/0214712 | A1 | | 9/2011 | Frazier et al. |

FOREIGN PATENT DOCUMENTS

| | | |
|---|---|---|
| EP | 1939388 | 7/2008 |
| JP | S54-18762 | 2/1979 |
| JP | 57142444 | 9/1982 |
| JP | 58179771 | 10/1983 |
| JP | S59-119135 | 7/1984 |
| JP | 60120143 | 6/1985 |
| JP | S60-178671 | 9/1985 |
| JP | 5178298 | 7/1993 |
| JP | H11-243225 | 9/1999 |
| JP | 2001-210854 | 8/2001 |
| JP | 2006-046001 | 2/2006 |
| JP | 2006-80462 | 3/2006 |
| JP | 2007231613 | 9/2007 |
| JP | 2008-151490 | 7/2008 |
| WO | 0216707 | 2/2002 |
| WO | 02/084182 | 10/2002 |
| WO | 2007030732 | 3/2007 |

OTHER PUBLICATIONS

European Search Report issued in corresponding European Patent Application No. EP 09805585 on Mar. 5, 2014.

* cited by examiner

SOLAR ENERGY CONVERSION

RELATED APPLICATION

The present application is related to and claims priority from U.S. Provisional Patent Application, filed Aug. 6, 2008, Application No. 61/086,618, entitled "SOLAR ENERGY CONVERSION DEVICES AND SYSTEMS" which is hereby incorporated herein by reference in its entirety for all purposes.

FIELD

The present disclosures generally relates to radiant energy conversion. For example, some embodiments relate to the capture and conversion of solar energy into heat and electricity and to building design and control of energy conversion and usage systems.

BACKGROUND

Solar generation and cogeneration systems are becoming a logical alternative or addition to fossil fueled energy systems as fuel costs and environmental concerns increase. The solar heat that is simultaneously collected with electricity provides a major boost to an energy system's value. Unfortunately, however "solar cogeneration" systems need to be located at the site of use, which presents challenges to most existing or previous photovoltaic concentrator methods. Since the collected heat generally is at low temperature (typically 40-80 degrees C.), the heat energy cannot be transmitted far without substantial parasitic losses. Further, the capital cost of hot water and other heat transmission systems favors direct on site use. And, such low temperature heat generally cannot be converted in a heat engine to mechanical or electrical power because of the small temperature differential versus ambient temperatures. Accordingly, systems are needed that harvest light energy and transfer the harvested energy easily to the heating, lighting and electricity requirements at the site of use, such that the immediate needs of the site are factored into how the system is controlled.

Solar cogeneration technologies are, in part, held back by challenges in creating optical systems that are both inexpensive and that can be mounted or integrated into a building. One problem is the practical limit for how tall a design can be to withstand forces from windy conditions on the device and building on which it may be mounted. Tying a cogeneration apparatus into the foundation or load bearing structure of a building creates expensive installations and/or mounting systems to accommodate system stresses, particularly on the roof. Many commercial sites lack sufficient ground space for a reasonably sized system and roof-mounting is the only viable option to obtain sufficient collector area.

SUMMARY

The problems affecting solar energy collection technology such as efficiency and cost are addressed via embodiments of solar harvesting apparatus and methods of its use and incorporation into building structures, etc. discussed herein. One embodiment provides an electromagnetic energy harvesting apparatus, comprising: a front light transmissive cover; a rear cover; creating a volume between those covers in which an array of parallel slats reside, and upon which direct light impinges. Photovoltaic (PV) cells convert photons into electricity and are used to convert some of the light to electricity with much of the remaining incoming energy converting to heat and/or used as a light source. In an embodiment, fluid is forced through a passageway in thermal contact with the warm slats to harvest heat. In some embodiments, PV material may be applied to the sides of the slats facing the sun and the apparatus (with heat and electricity being generated—as well as diffuse skylight and secondarily reflected direct sunlight) can provide light to the space behind the apparatus. Accordingly, some embodiments may provide an apparatus which provides efficiency and economical benefits over existing systems.

In another embodiment, constructing the slats with concave shapes facing the incoming light, e.g., with appropriate slat orientation, and a specularly reflecting concave surface can create a region of higher intensity light on the back side a nearby slat. Putting PV cells in this region allows a smaller, less expensive area of PV cells to be used to generate similar amounts of power.

Yet another embodiment provides a light gathering apparatus, comprising: a first light transmissive cover over a large surface of an array; a second cover over a large rear surface of the array; a spacing between the light transmissive covers, an array of parallel arranged slats within the spacing and held together at least in part by two or more bars attached to slats of the array, each slat having a concave curved front side with a reflective surface, and a convex curved rear side with a photovoltaic energy converter on at least a portion of the rear side; a light transmissive cover on a large front surface of the array; a light transmissive cover on a large rear surface of the array; and a rod perpendicular to the slats as a slat positioner to coordinately open and close the slats while maintaining the slats in a substantially parallel relationship, e.g., with fluid in thermal contact to remove heat.

Another embodiment provides a rooftop light energy harvesting apparatus, comprising: a single paned light transmissive cover facing out; a double paned light transmissive cover facing in; and an array of parallel arranged curved slats within the spacing, each slat having a concave curved front side towards the single paned cover with a reflective surface, and a convex curved rear side with a photovoltaic energy converter on at least a portion of the rear side facing the double paned cover, and wherein the slats optionally are of approximately equal length, so that the slat ends form an edge.

Yet another embodiment provides a rooftop or window system for harvesting light and heat from the sun, comprising: a first light transmissive cover facing out; a second light transmissive cover facing in; an optional spacing between the light transmissive covers, making the covers generally parallel with each other; an array of parallel arranged curved slats within the spacing, each slat having a concave curved surface facing the first light transmissive cover, and a convex curved rear light absorbing surface facing the second light transmissive cover, and wherein the slats optionally are of approximately equal length, so that the slat ends form an edge; a fluid conduit in thermal contact and optionally built into each slat; a pivoting mechanism to adjust the angle of the curved front side of the slats with respect to light from the first transmissive cover; a sensor that generates signals corresponding to inside light; and a controller; wherein the controller adjusts the pivoting mechanism in response to detected light and/or stored sun tracking data to maintain a constant or desired light level.

Yet another embodiment provides an automated system that responds to energy input or demand for a heat load, comprising a converter as described herein, and further comprising a computer, at least one sensor for detecting at least light or temperature, and at least one signal output to an actuator for adjusting slat position. In an embodiment, the automated system further comprises a light sensor located in the enclosure interior. The automated system further may comprise a feedback circuit and/or software that responds to output from the light sensor in the enclosure interior by adjusting slat position to maintain a constant or select light level within the enclosure interior. In some embodiment, the automated system may control a building, and comprise a temperature sensor within the building, wherein a signal from the building temperature sensor is input to the computer for control of slat position to maintain a select temperature. In one embodiment, the automated system may comprise a front light transmissive cover that is integrated as part of a building's weather envelope.

Many other embodiments are presented and also will be appreciated by a skilled reader.

BRIEF DESCRIPTION OF DRAWINGS

The detailed description is provided with reference to the accompanying figures. The use of the same reference numbers in different figures indicates similar or identical items.

FIGS. 2a-2d show cross sections of solar radiation incidence angles and slat configurations according to some concentrating embodiments, where FIG. 2a is for the sun angle at −15 degrees, FIG. 2b is for the sun at +15 deg with corresponding slat angle adjustment, FIG. 2c is for 45 deg sun angle, and FIG. 2d is 55 deg sun angle.

DETAILED DESCRIPTION

In the following description, numerous specific details are set forth in order to provide a thorough understanding of various embodiments. However, some embodiments may be practiced without the specific details. In other instances, well-known methods, components, procedures, and/or circuits may have not been described in great detail so as not to obscure the particular embodiments.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Some embodiments utilize an innovative two-dimensional radiant energy converter ("converter") that is built in a variety of configurations, incorporated into larger structures and controlled in useful ways to lower the cost and/or increase efficiency of electromagnetic energy (e.g., sunlight) collection and conversion. Broadly speaking, the energy converter comprises coordinately positioned slats that form a face for admitting light that is transparent to electromagnetic energy, such as sunlight. Embodiments of the converter convert radiant energy that pass through the transparent surface into electricity and/or heat in a variety of innovative conformations, based on reflection and/or absorption on slat surfaces within the converter. Energy is removed as heat from the energy converter, and optionally as electricity. The opposite face of the converter may be transparent or may be absorbent, and the converter may control the amount of radiant energy that passes through unabsorbed. In an embodiment, the slats of the converter are designed for a single reflection of radiation onto a target or for absorption. Alternatively or in addition, the converter may allow visible light to pass through to spaces behind the converter, e.g., as a light source.

Some packaging configurations of the radiant energy converter allow heat removal into re-circulating fluid and can be adapted for existing energy systems or incorporated into new buildings. Photovoltaic (PV) surfaces can be placed on the outward facing slats or using the slats as a concentrating "lens" to create more electricity per unit area of expensive PV material. Specific designs and methods for adapting the 2 dimensional radiant energy converter into a building such as a roof, wall, or window are provided that limit environmental exposure compared to conventional designs. Still further, methods are presented for intelligent control and use of the converters to satisfy changing heating, lighting and electrical demands of a building.

The Planar Radiant Energy Converter

Some embodiments incorporate one or more converters, each of which comprises multiple slats arranged so as to form a planar structure that intercepts radiant energy such as microwave energy and light energy. A converter may include a first front face that permits entry of radiation (e.g. transparent to sunlight) and a second rear face that may be transparent or opaque to the radiation. The faces may be parallel to each other but can be generally parallel (off from parallel by up to 30 degrees) or even oblique to each other.

The (generally) parallel faces enclose the slats and may have closed edges to form an air tight box with flat sides, with slats of equal length lined up in a rectangular area within a box shape converter. The converter may be at least 5 times, 8 times, 10 times, 15 times or at least 20 times as wide and as long than it is thick. The thickness may be between 5 cm and 100 cm, or between 7 cm and 60 cm, or even between 9 cm and 25 cm. In this sense the converter may be thought of as a planar energy converter with a defined two dimensional radiant energy input face, which may be a glass or clear plastic transparent window. The converter may be a stand alone box with, for example, one set of slats, or alternatively with more than one set of slats or may be multiple boxes that work together, by sharing common edges, common fluid flow, and/or by sharing common conduit for transfer of heat energy via a liquid or gas.

In one embodiment the light transmissive window or cover of the converter has a mechanism for removal to clean the cover. The mechanism may be any of a variety of structures, as will be appreciated by an artisan in the window or skylight field. In an embodiment, clamps may be used to hold the cover onto the converter. A stream of air, such as from a small pipe may be used to blow across the window to remove dust. A pipe, or sprayer of water or other liquid may be positioned to wash the window. The entire converter may be tilted and water or other fluid or a gas sprayed onto the window surface, to allow particles to fall away. Some embodiments may utilize a domed cover, e.g., to provide some structural stiffness, allowing thinner material thickness, as well as self cleaning properties from periodic rainfall.

Slats for the Energy Converters

Slats may be of any material and size as suited for a situation. In some embodiments, the slats are at least 10 times, or at least 15 times, 20 times or at least 30 times as long as they are wide. In an embodiment the slats are several centimeters wide, e.g., 3 to 25 centimeters, and at least 30 centimeters, or at least 50 centimeters or at least 100 centimeters long. The embodiments that concentrate the sunlight may have a concave "front" side of the slats (which may be reflective in an embodiment) with a white coating, a polished aluminum coating, silver-based specular mirror coating or other treatment to reflect the radiation. This surface may be oriented to catch and reflect radiation that enters the converter. The convex "rear" side of the slats may be opaque to the radiation and for example may be black to absorb sunlight in some embodiments. The rear side may be covered at least in part by a radiation to electricity transducer, such as a solar cell or PV for sunlight radiation.

The slats may be continuously curved and also may be facetted. In one embodiment, the slats may be parabola shaped from one side of their width to the other. In an embodiment the slats are not parabola shaped but employ a progressively curved surface where the radius of curvature continuously increases from edge to edge, e.g., for a better reflecting optical surface. Using this design, it was seen that as the sun angle changes, simply rotating the slats by translating the relative positions of each edge with respect to each other can result in a distorted focal region. The clean and sharp concentration achieved with the sun at an optimum design angle is no longer a classic focal point in these off-design incident light situations.

Figure 1A:
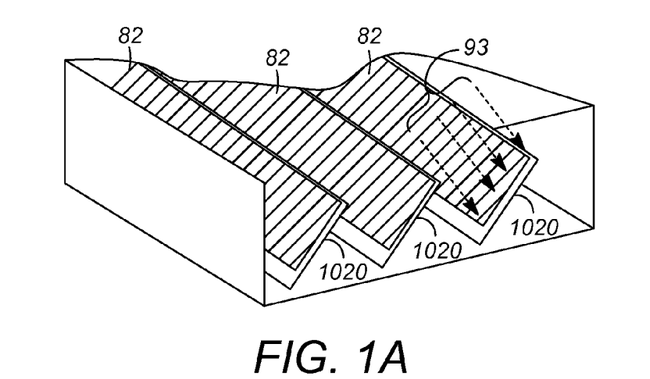
FIG. 1a illustrates a perspective view of a non-concentrating location of PV material, according to an embodiment.
Figure 1B:
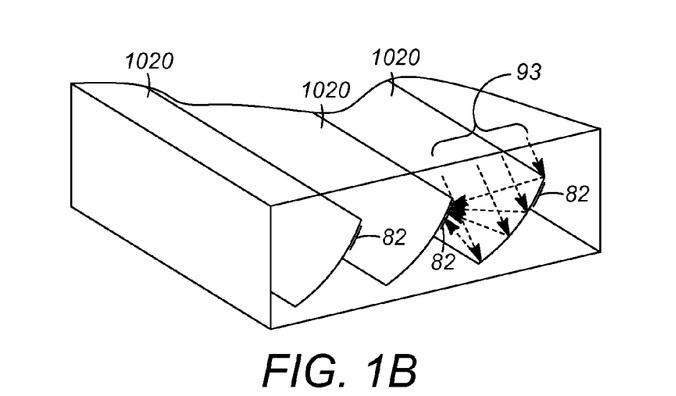
FIG. 1b illustrates a perspective view of a concentrating reflective lens to reduce the PV area in accordance with an embodiment.
Figure 1C:
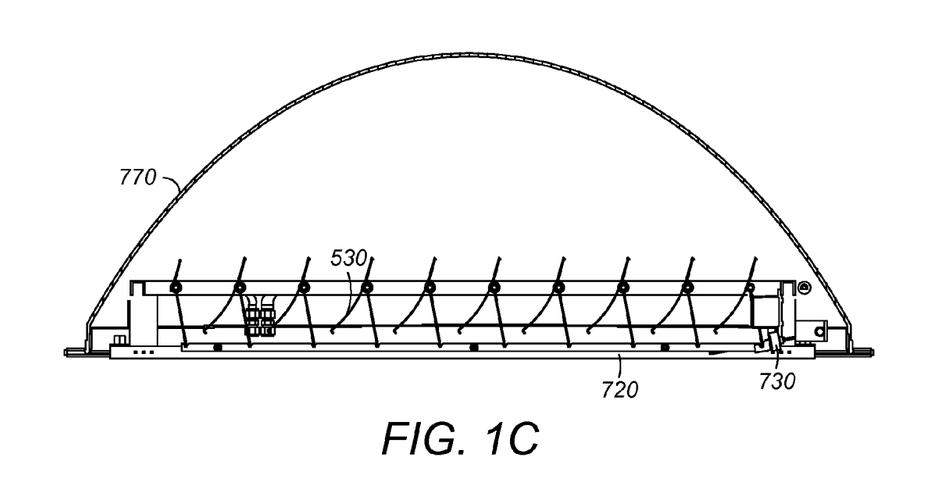
FIG. 1c illustrates one embodiment of a transparent converter cover.

FIG. 1a illustrates a perspective view of a non-concentrating location of PV material, according to an embodiment. FIG. 1b illustrates a perspective view of a concentrating reflective lens to reduce the PV area in accordance with an embodiment. As shown in FIGS. 1a-1b, direct sunlight 93 may be incident on PV material on slates (also referred to herein interchangeably as "louvers") 1020, where PV material in FIG. 1a is present on the top surface of slates 1020, where as PV material in FIG. 1b is provided on the back side of the concentrating slats (82). FIG. 1c illustrates one embodiment of a transparent cover (770) (e.g., provided over a converter as a converter cover) that functions to isolate the air near the slats from the outside or ambient air allowing higher temperatures for the harvested heat. Also, the cover 770 may provide isolation from other elements such as rain, snow, etc.

Figure 2A:
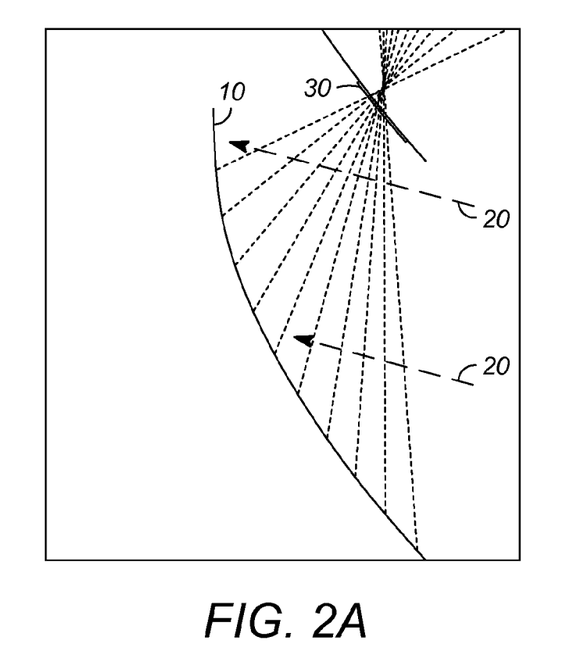
Figure 2B:
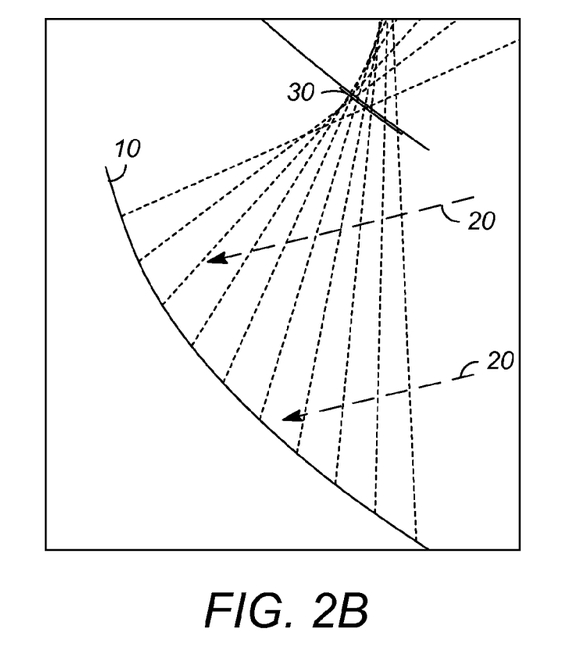
Figure 2C:
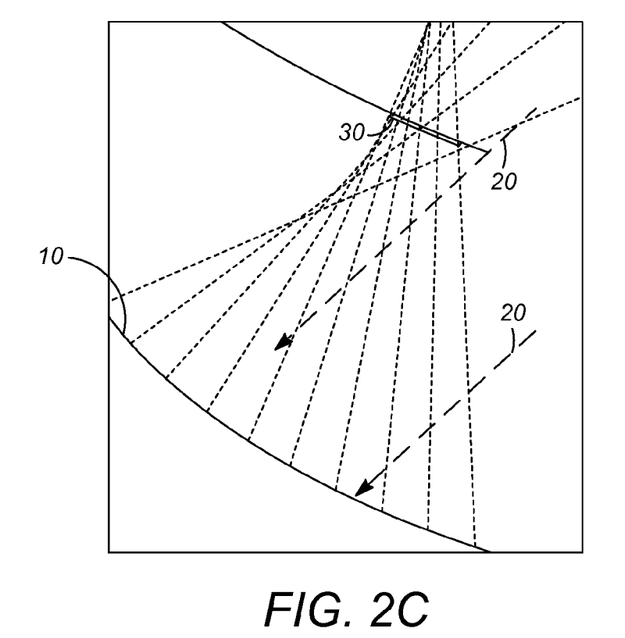
Figure 2D:
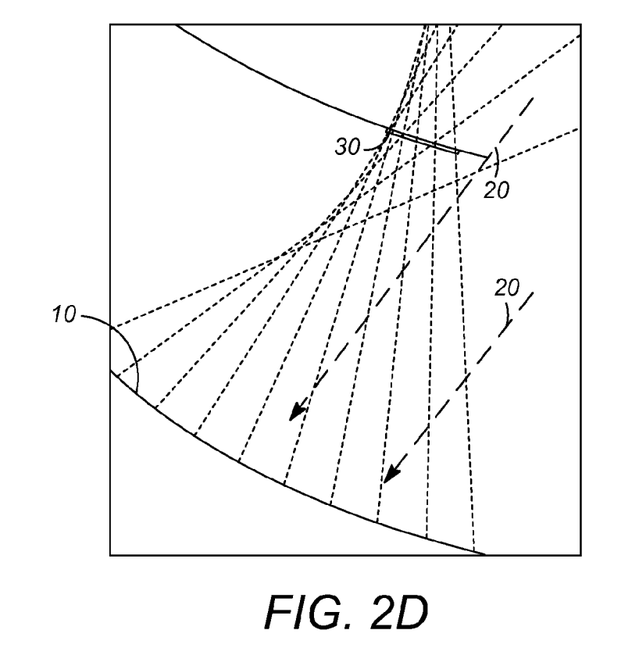

FIGS. 2a-2d show alternative solar radiation incidence angles and slat configurations according to an embodiment illustrating that as the sun direction changes in one direction (away from a vector pointing from the middle of the concave surface to the PV array on the next slat nearby), there are 2 "loss" mechanisms that arise: 1) light never intercepting the reflector and 2) focusing losses. Both of these loss mechanisms can be minimized by adjusting the length of the slat and adjusting the curvature of the slat. FIG. 2d shows solar radiation incidence angles and slat configurations according to an embodiment that illustrates that designing the slat shape for a negative 15 degree sunlight angle still has very good effective capture with the sunlight 70 degrees away from that design angle (+55 degrees).

These drawings show that as sunlight angle changes, the slat angles may be altered such that sunlight hitting the outer most part of the reflector (right edge in this view) is directed at or near the right edge of the solar cell. This design accommodates the defocused optics by using a receiving area on the rear of the rear slat wide enough to accommodate much of the distorted focal line.

Another optional criterion for slat shape is maximization of captured light incident to the slat and control of the amount of light to permit light to pass through the converter. Swiveling the slats for maximum energy capture may be used in this context, as exemplified in U.S. Pat. No. 4,690,335, the contents of which (particularly slat configuration and control), are incorporated by reference for what they teach in this area. In particular, the slat confocal line becomes "distorted" for radiation that is not along a designed-for-direction. Although slat swiveling is used to compensate for much of this distortion, a parabolic shape no longer has a focal line when the orientation of parallel, direct radiation is not from the design angle. Also, the focal line translates and rotates as the slats rotate. However, the combination of wide focal area, such as a solar cell reflection target of at least 10% as large as the reflecting surface may provide suitable focal areas that can be captured. Often, some distortion may occur from the reflected light off the most interior part of the slat, but one finds that this area is shaded by a nearby slat. The light reflected off of the illuminated section of the mirrored slat may remain relatively in focus.

Some slat orientations are exemplified in FIGS. 2a-2d. These figures show how orientation of the concave surface of the slat can be modified for different radiation angles. Light that enters the converter more parallel to the slat at an off design value is more difficult to capture.

Slats may be formed of any material; although formed sheet metal (e.g., aluminum) may be used (as roll forming appears feasible and can be very low cost in high volume). Extrusion also appears feasible. In an embodiment, slats are formed from a plastic that may be further coated with reflective and/or absorbent coating and optionally with electronic material such as a flexible photocell. A challenge with plastic slats is the poor heat conductivity of plastic will not spread the absorbed heat very well in the embodiments with the concentrating optics. The material may be coated to become reflective or absorptive, and may have a specular mirror finish, coating, or film to allow reflection of radiation on a smaller, rear absorptive surface of an adjacent slat in the concentrating embodiments.

In an embodiment, different parts and processes may be used, e.g., mated together, to create the overall slat. For example, an aluminum extrusion can have features of the cooling channel and PV mounting shape explicitly tooled in, but then provides the mirror function with a separate mirrorized sheet metal part that it bonded to the extrusion. Less metal can be used with this technique and thermal losses can be reduced due to the less conductive mirror sheet extending away from the focal and cooling channel zones.

Figure 3A:
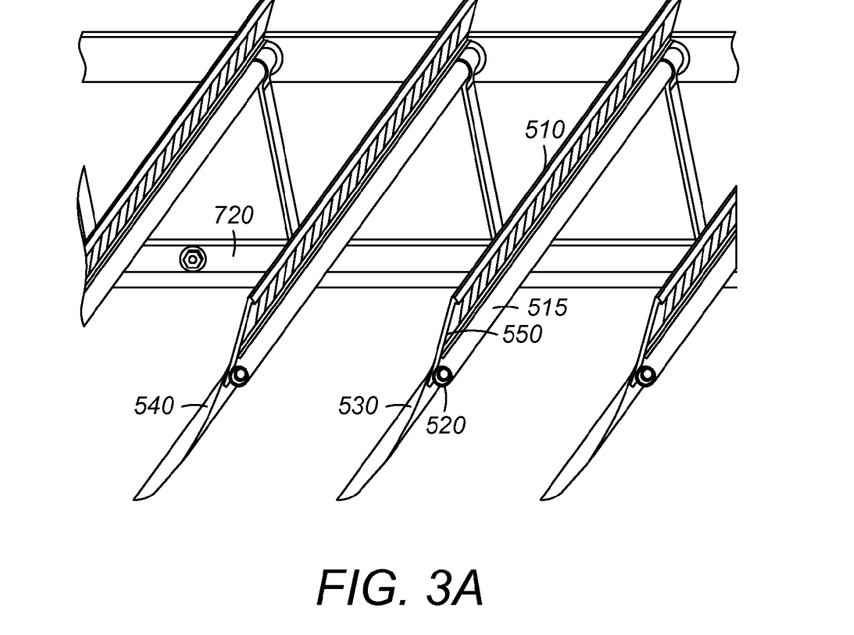
FIG. 3a is a perspective view of a converter corner and shows an arrangement of a solar cell holder, curved reflector, fluid conduit and fluid conduit pivot end portions, according to an embodiment.
Figure 3B:
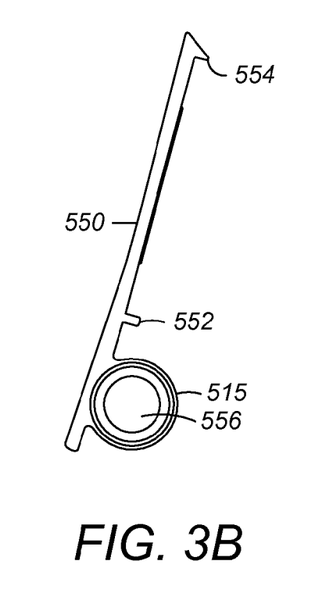
FIG. 3b shows a simple cross section of the extruded element with the platform for the PV material and the coolant/mounting tube and the capture/indexing feature for the mirror mounting, according to an embodiment.

In one embodiment, the slats are mounted parallel to each other. Their parallel orientation may be maintained by a structure or mechanism. One embodiment uses the cooling tube as the mounting feature, as shown in FIGS. 3a and 3b. Linkages to effect the actuation may be on the side of the planar array opposite the incoming radiation to avoid or at least reduce casting shadows on the mirrors and subsequently on the solar cells in the focal region. Alternatively, transparent (e.g. polycarbonate) or comparatively thin (strings or wires) materials could be used in linkages that are between the mirror and the radiation source.

An embodiment provides a lower cost and more convenient to manufacture converter design by virtue of the relatively short focal length from one slat to the other, and consequent relaxed focus target area requirements. The actual curvature of the slat can vary plus or minus 2%, 5%, 10% or more and the actual distance from slat to slat (focus distance from reflector to absorbing target area) can vary plus or minus 2%, 5%, 10% 20% or more. Thus, the design according to this embodiment provides looser tolerances on the slat shape, linkage spacing and controller precision compared to other, more expensive solar concentrator designs. Furthermore, the overall scale of the slat and linkage mechanism is selected so the relatively easily achievable tolerances for the mounting features can be used and result in effectively uniform pointing of multiple slats in the mechanical assembly. This saves costs and aids in manufacturing precision.

Figure 4:
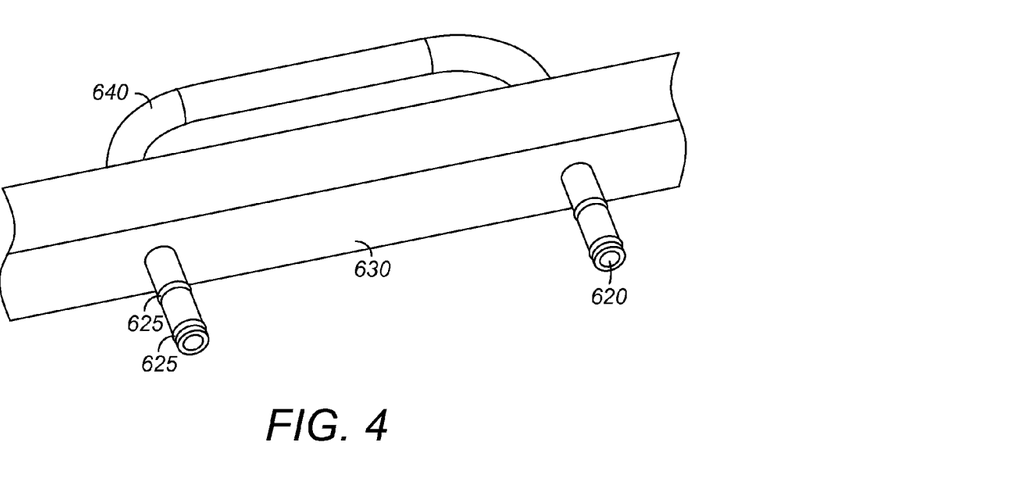
FIG. 4 shows details for a fluidic pivot coupling between a louver conduit and a converter box end, according to an embodiment.

Referring to FIGS. 3a to 4, the slats or louvers are mounted, in an embodiment, by concentrically mating the coolant passage (520) on the louver with a fluid coupling (620) that is mechanically mounted in a shared bulkhead of other structure to support the louvers by its ends. In an embodiment, the louvers may be primarily constructed of Aluminum. O-rings, made of materials compatible with the coolant, metals and operating temperatures, are mounted onto the fluid coupling with appropriately designed notches or glands (625). These o-rings may provide 2 functions; they are the liquid seals to keep liquid from leaking at that interface and are also the bearings that support the louver while allowing rotation with a relatively small amount of torque. Less torque means less expensive actuators, lighter linkage components. Smaller diameter o-rings and the liquid couplers also lowers the required rotational torque, but the diameter is limited to the sizes required for adequate fluid flow and associated pressure drop in the coolant circuit (including in the louver passage and the liquid coupler). Multiple o-rings can be used for redundancy and to reduce the reaction loads on them from the weight of the louver.

In some embodiments the heat transfer is to fluid that circulates by a pump. A skilled artisan readily can appreciate the size and configuration of conduit and the pumping flow rate. A sample fluid is water with an antifreeze agent such as propylene glycol.

FIG. 3a shows section view of a panel with a louver 510 that pivots on a conduit with end 520 shown in this cutaway view. Louver 510 has, on its backside (facing left and up as shown), curved reflector 530, which focuses incoming light onto the front of adjacent louver 540. Conduit 515 with end 520 in this example is continuous with solar cell holder 550. In one embodiment (e.g., such as shown more clearly in FIG. 3b), solar cell holder 550 may be flat surface to receive solar cells. In an embodiment, curved reflector 530 is manufactured separately and attached to the backside of a single extruded piece of aluminum and the extruded aluminum includes conduit 515 portion with end opening 520 portion and solar cell holder portion 550. This figure shows three such louvers that are coordinately pivoted on conduit ends (two ends are shown). Turning is achieved by movement of actuator 720 along the actuator's long axis.

FIG. 3b shows a close up cross sectional view of a conduit 515 and solar cell holder 550 made as a single piece. This figure shows protuberances 552 and 554 on the distal and proximal ends from the rotation axis, respectively, to provide surfaces for assembly indexing/precision and to provide a dam for the encapsulation materials that seal the PV cells. Conduit opening 556 is continuous with openings at each end of the louver and, e.g., extends through a side holder mount, or mate with couplers on side holder mounts as shown in FIG. 4.

FIG. 4 shows converter frame side 630 with pivot mount opening 620. Opening 620 has been fitted with a protruding nipple that has two o-rings 625 to form a fluid tight seal with a fluid conduit having a larger opening that slides over the o-rings in use. Opening 620 fluidically leads to pipe coupling 640 on the outside of the converter box, which connects to an adjacent pivoting conduit above (outside this perspective view). Opening 630 illustrates how the protruding nipple is firmly and precisely supported into a frame to react the weight of the louvers into a base structure (not shown).

FIG. 4 shows how a louver can connect to and rotate about a fixed fluid conduit connection. Variations of this arrangement are contemplated, wherein the fluid conduit connection may be rotatable, and wherein other fluid sealing mechanisms may be employed, such as single o-ring, triple o-ring, magnetically mounted seals and the like. In an embodiment where large sized louvers are used, a variety of bearings may be used, as will be appreciated by a skilled artisan.

Figure 5:
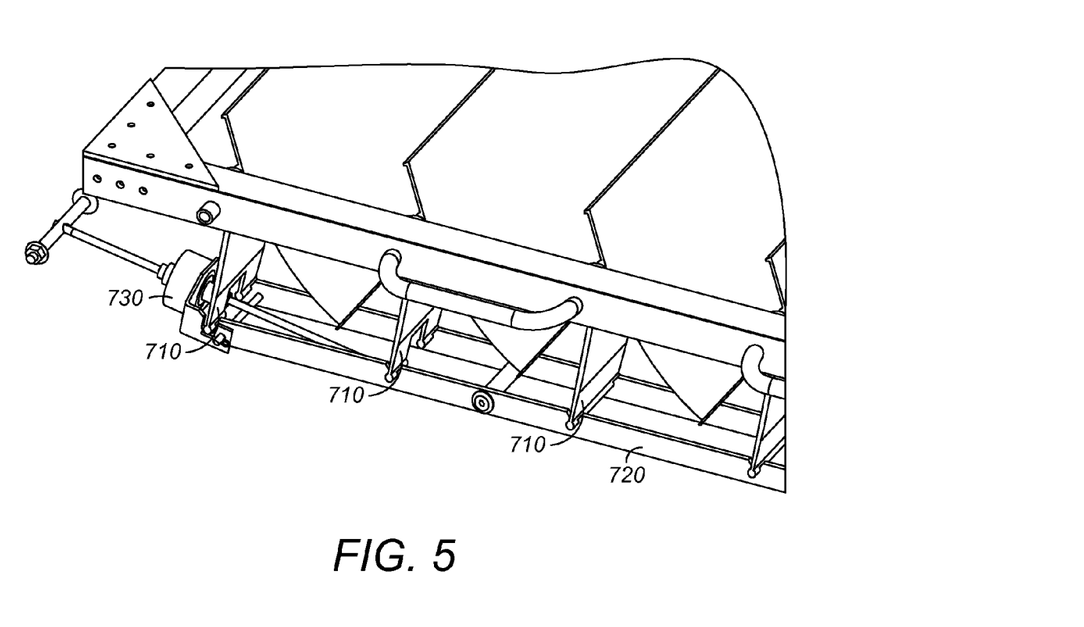
FIGS. 5 and 6 illustrate actuation designs, according to some embodiments.
Figure 6:
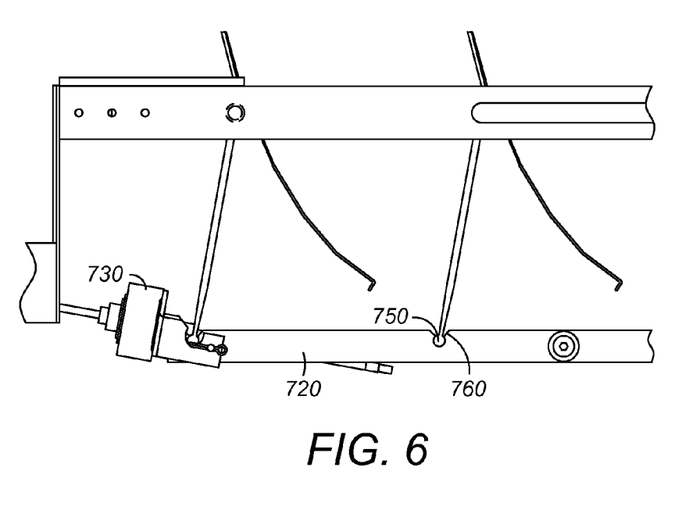

FIG. 5 illustrates one linkage technique, where linkage arms (710) are mounted to the slat at one end and has a cylindrical feature at the other end that interfaces with a common bar or assembly (720) such that translation of the actuation bar (720) rotates all the slats equally using a shared actuation device (730), e.g., an electric-motor driven actuator (such as a stepper motor). A multitude of actuation techniques could be employed to ensure that the slats all have the same orientation to the radiation source to with a fraction of a degree. Features on the actuation bar (720) and link arm (710) show one way to connect these moving parts. FIG. 6 shows a cylindrical feature (750) at the end of the link arm rotates inside a capture feature (760) on the actuation bar. The capture feature includes clearances for the link arm in wide range of angles between the link arm and actuation bar. Some of these alternative mechanisms are listed in an earlier United States Published Patent Application 20090173375, filed Jan. 7, 2009, published Jul. 9, 2009, assigned to assignee of the present application, which generally could be applied to this design as well, which application is incorporated herein by reference for at least the aforementioned purpose.

Other ways to route heat transfer fluid in contact with the louver are contemplated such as the use of small veins in the louver, encasing the louver in a volume of fluid, which may have a low boiling point and present a partial liquid/gas admixture such that heating of the fluid by the louver surface causes boiling, or spraying fluid onto the louvers, either in a closed or open loop system. Fluid may enter a converter via one or more apertures and then distribute through a large space, or alternatively, be routed through one or more tubes in contact with louver(s) as shown in FIGS. 3a/3b and 4. Heated fluid may exit as a hot liquid, a gas, or admixture, either from a large space enclosing the louvers, or via discrete conduits that route fluid onto or through each louver, as shown in FIGS. 3a/3b and 4. The particular application is decided by the temperatures encountered. In a very hot environment, such as a microwave absorption louvered array, a liquid to gas conversion within a large space may be used.

In an embodiment, reflector 530, conduit 515 and solar cell holder portion 550 are constructed as a single piece, e.g., made of thermally conductive material. In one instance, solar cells are adhered to holder 550 via an electrically non-conductive, thermally conductive adhesive, such as thermally conductive epoxy.

In an embodiment, fluid flow within a conduit along the length of slats absorbs heat from the slats and then passes out the end of the slat and into the mount/pivot/coupling end of an adjacent slat. In this way heat from multiple slats is absorbed and then finally given at a heat exchanger outside the converter.

Solar Electric Conversion

An embodiment provides lower cost electrical energy conversion by focusing light from the concave curved fronts of slats onto smaller photoelectric (i.e. radiation to electricity converting) regions on the convex rear surfaces of adjacent slats such as solar cells. In an embodiment, the focus ratio (light reflection area of concave front portion divided by the solar cell area located on the rear of the adjacent slat) is between 2 to 50, or between 4 to 10. This optical design may be limited to only about 8 time concentration if the angle of incidence of the parallel radiation is wide (e.g., the sun passing through the sky with a fixed planar collectors orientation). For applications with narrower range of incident angles higher concentrations can be achieved. FIG. 2a shows an optical layout of a representative concentrating slat design. Two slats are shown in each section, with sunlight and slat angles changes. In the top left side of this figure shows the design sunlight and slat angle, sunlight (in long dashed lines) shines at a negative 15 degree azimuth to the left side and reflects off concave slat surfaces (10) as dotted lines (20) into solar cells (30) according to a design angle. Solar cells (30) are located on a rear portion of each slat onto which light is focused. FIG. 2d shows that slat adjustment to accommodate sunlight shining from a 55 degree azimuth allows focus onto the same solar cell area despite changes in azimuth.

Figure 7A:
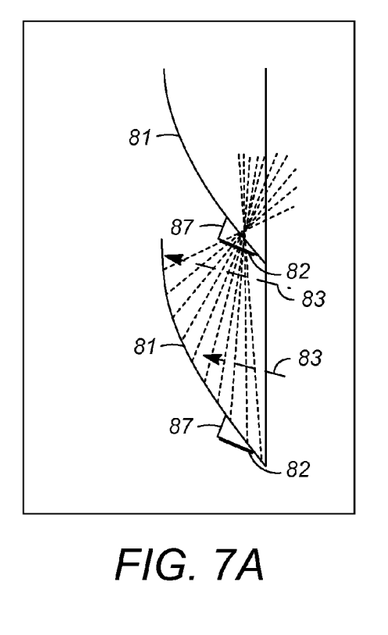
FIG. 7a shows a solar cell placement with a raised area on the back side of the slat, according to an embodiment.
Figure 7B:
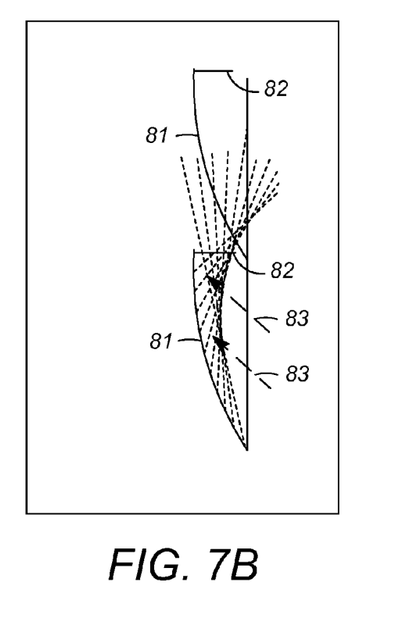
FIG. 7b shows a PV cell location on a flange off the inboard edge of the slat, according to one embodiment.

The solar cell (or other radiation to electricity conversion device) in an embodiment is placed on another part of the slat, or off the slat. See, for example, FIG. 7b, which shows slat reflector surface 81 with attached solar cell 82 substantially perpendicular to the reflective surface. Other angles are intended for other embodiments, but are not shown here. As shown in FIG. 7a, light rays 83 impinging on reflector 81 are directed onto the adjacent surface of attached solar cell 82. In an embodiment, the solar cell is on a tab at the inboard end of a reflecting slat. FIG. 7a shows two slats with solar cells 82 on their rear surfaces but spaced off via hat structure 87. The location of the cooling channel is not shown in these figures but could be at many locations along the slat, with some having locations near the absorber/focal region to minimize the temperature difference required to conduct the heat through the louver from the focal region to the coolant channel. If the thickness of the louver is sufficient (for example, about 1 mm or more for some embodiments) the proximity of the coolant channel to the focal region is somewhat flexible due to high conductivity of metals commonly envisioned for many embodiments.

Cost reduction may occur from concentrating sunlight onto smaller solar cell surface areas, and by using materials (reflective slats) that are cheaper per surface area unit than semiconductors for light absorption. In an embodiment the louvers are stamped or formed sheet metal, or aluminum. By using relatively small louvers and enclosing them away from wind forces, the force needed to move optical surfaces (slats) is very small compared to that needed for many previous systems of comparatively large collector areas. In an embodiment, short optical paths of approximately 5-15 cm are used, along with moderately low concentration ratios of about 3 to 10. These dimensions provide looser manufacturing and tracking precision tolerances compared with that needed previously for systems having longer paths and higher concentration ratios. Cost savings thus exist in manufacturing the solar collector surfaces, the system to hold the surfaces at their proper spacings, and in the simpler tracking system needed to obtain good efficiencies.

Solar cells in an embodiment are attached directly to thermally conductive metal slats to facilitate heat transfer from the solar cells to the slats. Thermally conductive adhesive may be used. Conductivity can be enhanced in adhesives often by mixing very fine highly conductive powders (metals if electrical conductivity is acceptable or ceramics if not) into the adhesive. In an embodiment, electrically and thermally conductive epoxy such as silver filled, aluminum filled, or bromine intercalated graphite filled epoxy is used to both electrically and thermally connect a back surface of a solar cell onto a metal slat. A second connection to the solar cell may be made on a top surface or edge via wire that may connect to a metal linkage, or run along a linkage such as a mechanical linkage that holds the slats together or that pivots them together.

An embodiment provides non-symmetric curved reflectors that concentrate light efficiently at various radiant energy angles onto a target solar cell surface. For example, when the radiation vector becomes more parallel to the slats, a lower percentage of the radiation becomes captured. In some cases such radiation passes through the converter as illumination, potentially reducing electrical lighting needs. Such features may be exploited as a window treatment wherein direct light heat gain and glare may be controlled along with electrical power generation and even thermal power generation. Other applications include use as a skylight without the problematic heat gain and glare for occupants that conventional skylights often have, while also creating an outdoor feel to a building interior when the sky can be seen undistorted by translucent coverings that otherwise may be used to correct heat gain and glare.

In an embodiment, one axis tracking is used to orient reflecting concentrators. This can create shadows and possibly radiation leakage near the ends of the photoelectric arrays, such as when the sun is substantially non-normal to the array in the non-tracked axis. This issue can be mitigated by omitting solar cells at slat edges and/or by adding bypass diodes to one or more solar cells so that shadowing does not substantially diminish the electrical output from radiation to an electric power circuit.

In some embodiments, dioding is an effective practice for any cell or group of cells that will have a shadow on it for any reasonable period of time—particularly those at the ends of the louvers where the source (sun) motion in the non-tracking axis combined with the focal length creates a longitudinal area without sunlight on it (the "shadow"). For example, a diode across each cell is a good idea in general because the voltage loss (not less gain but actual negative gain) of trying to drive a solar cell at the current of the illuminated cells is much higher than the loss thru the diode. So, even though the voltage loss in the diode from this "bypass" circuit is comparable even larger than the lost power of the non-illuminated cell, the penalty for no diode and non-illumination is much higher because the non-illuminated cell can become a substantial power sink when flowing the current of the illuminated cells and is not illuminated. Scenarios where different dioding schemes might make sense include a) when the cell's length is small compared to the focal length such that there are many cells (in series) such that the cost versus performance tradeoff suggests aggregating several cells per each diode, or b) if the cell is rarely and/or only partially shadowed no diode may be more cost effective. One variation of this might be multiple cells wired in parallel effectively making the "cell"

very wide. At the extreme, all the cells on a slat could be in parallel so the shadow would be uniform from one slat to the next.

Analysis and experiments suggest that dioding cells is beneficial cells near the end of the slat for a length about 2 to 4 times the slat pitch.

Heat Transfer Fluid from the Converter

As described, the converter may have an array of slats with slats parallel to each other and coordinately controlled to swivel with a linkage. In some embodiments, the slats swivel around a conduit end that serves two purposes, to pass heat transfer fluid from a slat, and to mechanically hold and rotate the slat in place. The flow rate of fluid within the slats may be controlled to optimize energy used for pumping. For example, a heat sensor in contact with or that otherwise senses slat temperature monitors temperature and can activate a pump by turning on or by increasing power to the pump, or by otherwise diverting greater fluid flow rate into the slat, upon sensing a critical set high temperature limit.

Fluid that circulates along the slat length may be used directly for heating by forming a circuit with heating pipes, such as a radiator in a building. In this case a pump may be placed anywhere in the circuit. Alternately, heated fluid from contact with slats may transfer heat energy to another fluid, gas or solid via a heat exchanger that may be packaged within the radiant energy converter, located adjacent to the converter and optionally in combination with a group of converters, or located a distance away through which the heat transfer fluid travels. In an embodiment, a low boiling point fluid is used and turns into gas within the slat conduit as a high temperature generating part of a mechanical heat engine.

A converter may comprise two large area faces, sides (e.g., 4 sides if rectangular shaped, etc.), one or more arrays of slats that are mechanically coupled to at least one face, and conduit end may pivot that acts as fluid inlets and outlets for circulating fluid among the slats. A face should be removable to allow cleaning of the slats or other parts inside the converter. To allow easy cleaning, and associated cover removal the size of the converter area may be less than 4 square meters. Solar cells mounted directly onto the slats may be flat, or even curved and either mechanically contact a thermally conductive (e.g. metallic) slat surface or are bonded via an intermediary conductive adhesive or fastener. Photocells that cover about 8-20 percent of the rear slat surface were found to transfer adequate heat to aluminum slat surfaces in some embodiments.

Powerskins: Converters Incorporated into Buildings

When incorporated into a building a converter acts as an exterior layer and provides some exterior protection. In this context, the converter may become part of the building, either added to an existing structure, or incorporated into a new structure and is termed a "powerskin". A converter that is intended for installation as a powerskin may be advertised, sold and/or packaged with installation instructions, with one or more sensors and/or with one or more effectors suitable for use in an integrated building system. Such converter that is accompanied by an instruction manual or by one or more system sensors/effectors is intended for powerskin use and said to be an uninstalled powerskin. A converter that has one or more electrical connections for sensory or effector signals to a controller thus is termed a "powerskin" by virtue of having one or more input/output connections that allow use of the converter as part of a larger building energy system.

As a powerskin, a converter may provide insulation and can control the amount and type of energy that enters from sunlight or other radiant energy into the building. The powerskin has an exterior face or "cover" to the weather and an interior face to the building, or building interior. The cover in this embodiment acts as a weather guard for the converter and the building. The cover may minimize reflectance and absorption losses of the sunlight passing through the converter and provides an enclosure for the heated air to keep the heated air separate from the external air.

A variety of characteristic features may be modified that trade off the cost of a powerskin, the powerskin's insulating performance and visible light transmission through the powerskin. The back face of the converter can be transparent (for daylighting applications) or opaque, which affords better insulation options and lower cost. In an embodiment a multi-wall plastic/polycarbonate back wall provides a lightweight, structurally robust barrier with superior insulation than glass, although glass generally is more transparent and often less expensive. The converter back optionally supports the bottom slat spacers.

Glass glazing may be used in combination with a powerskin to form a very robust structure to resist weather. Because the powerskin optics are within an enclosure and protected, wind loads do not affect optics actuation. Other optical concentrators are exposed to wind forces on their tracking actuators, which incurs greater installation and maintenance costs.

In some embodiments, these collectors are installed in an east-west axis and have a tracking axis that follows declination of the sun. Near the summer or winter solstices this declination will vary substantially throughout the day, and the angles differ greatly in the mornings and evenings from summer to winter. Such configurations may use sunlight variations of approximately 130 degrees or even more for summer mornings where the sun rises north of east in the northern hemisphere and a horizontal east to west axis array would need to point directly north at dawn and directly south for winter dawn and dusk. The practical amount of light in these transitory periods is small. Accordingly, optimized performance for more common orientations results in more net power collected per year.

The collector optionally may be tilted towards the equator or south in the northern hemisphere, which reduces the southern most extreme because the southern horizon is no longer 90 degrees from normal. Thus leaves the northern horizon further from normal. Each of these installations can employ powerskins as described herein and, in combination with a building structure, is intended also as an installed embodiment.

The linear nature of reflecting optics may allow a single axis design wherein light incidence variations in the non-tracked axis can vary significantly without changing the focal line in the tracked axis. That is, as radiation incidence angle moves across a non-tracked axis, the light shifts in an out of the plane in this view, but the concentrated light area remains. Advantageously, this design allows the use of a true single axis tracking system that does not require tilting. Of course, cosine losses occur with declination changes throughout the year, but the described system dramatically reduces wind loads on the system and tremendously simplifies the tracking mechanism. In an embodiment, the system is tilted as well to change the angle of incoming sun rays hitting the aperture for a specific time of the year.

In some embodiments for a flat roof surface, greater efficiency of light energy capture is possible by tilting the panels modestly (e.g., less than 45 degrees) to improve the incidence angle to the external glazing, and thereby reduce glazing reflection losses. In this latter embodiment individual boxed units of the energy converter can be installed to allow access between the rows for installation and servicing. In embodiments the gap size may be between 0.5 to 2.5 times the dimension of the module length in that spacing direction. The installed tilt of the converter affects the optimal spacing such that shadows from one row of converters rarely if ever fall on the row "behind". Minimum annual energy collection is lost because the tilted panel intercepts the light that would have otherwise fallen on the gap.

An embodiment includes at least one computer that contains stored year-long sun tracking data, such as sun angle for a given time. In an embodiment, the computer may be used as the controller discussed herein (e.g., with reference to the powerskin, etc.). Also, multiple controllers/computers may be used. For example, each converter may include a controller to control its stepper motor or adjustment of its louver(s). Also, a central or main computer/controller may communicate with one or more other controllers (e.g., provided for each set of louvers or converters) and manage adjustments to louvers (or other functionality within converter(s) such as discussed with reference to powerskin below) on a per converter basis, group of converter basis, regions within a building, etc. The computer may include: volatile (such as random access memory (RAM)) or non-volatile (such as flash memory, hard drive, optical storage device, etc.) device(s); one or more processors (e.g., to execute instructions and/or operate on data stored in the storage device(s)), and/or one or more buses or interconnects to couple various components of the computer, such as a network (e.g., wired or wireless network) interface device (which allows communication with other computers coupled to the network), a display device (e.g., a monitor to display images, data, etc. generated by the computer or other computers). The computer may be coupled to and operate one or more output electromechanical devices (e.g., via a communication interface such as RS-232, USB, network (such as Ethernet or IEEE 802.11a/b/g/n, etc.) such as an electrical actuator for altering slat positioning. In an embodiment the computer additionally controls the proportion of radiant energy entering the powerskin that is converted into heat versus electric energy. In another embodiment the computer additionally controls the proportion of radiant energy entering the powerskin that is converted into heat versus allowed to pass through as room or building lighting. In yet another embodiment the computer additionally controls the proportion of radiant energy that enters the powerskin that is converted into heat, into electrical energy and allowed to pass as room lighting. In another embodiment the computer additionally controls louver closure at night as desired, e.g., depending on the time of year and/or outside temperature to minimize or maximize heat loss.

Powerskin Control Systems

A powerskin control system, in an embodiment, comprises a sensory input signal (e.g., generated by a sensor in a converter, shared between one or more converters, associated with a region within a building or complex, etc.), a powerskin effector signal, a controller computer (e.g., with a controlling program that accepts sensory data and outputs control signals), and/or a powerskin (i.e., converter that is adapted to be installed into a building, or that has become installed into a building). A powerskin may be controlled to 1) intercept and convert the direct sunlight into electricity and heat, 2) open to allow the maximum amount of light into the building if very little direct light exists, or 3) close the louvers to darken the interior space and/or provide privacy. The control for one or more of these parameters may be automatic, e.g., based on configuration data stored in a storage device (such as those discussed herein with reference to the computer). For insulation, a controller can close blinds at night or when light intensity is below a specified threshold, indicates that more energy can saved by being in the maximum insulation mode instead of light collection mode. Closing the blinds at night automatically can enhance security by preventing views from outside in. In some embodiments, a control system trades off relative internal lighting versus heat collection versus electricity generation according to one or more algorithms that may be fashioned to maximize a desired condition.

In one automation embodiment, clouds passing overhead are detected, which affects electric output. In this situation, lighting can be enhanced by opening the slats to improve the "view factor" of the interior space to the sky and offsetting what might be dimmed lighting inside from the cloud effects. With this modification less lighting adjustment is needed with minimized loss of electric power for the temporary condition because the solar cell area is only illuminated by the missing direct sunlight. Somewhat simpler is the case of the sun going down or the sky becoming dark enough that the slats are oriented automatically to the night position for improved insulation and to minimize light loss through the collector aperture from interior lighting. These are all superior to conventional static skylights or window treatments.

Control systems can be connected to other building loads to minimize peak power draws from the building. Partly cloudy days can have substantially varying photoelectric output. However some loads like air conditioners, refrigeration systems, ventilation systems, or UPS charging systems can be modulated during periods of intermittent photoelectric power generation to drop the building's load when photoelectric power drops during cloudy moments. When sunlight returns or otherwise in a coordinated fashion these semi-discretionary loads can be turned back on or up. The "inertia" in the system (thermally for AX & refrigeration) allows negligible impact for such short duration modulation while potentially maximizing total electricity costs. This is because many larger buildings and power constrained areas meter power separately from energy to account for the utility's challenge to deliver enough power, as generation, transmission and distribution infrastructures are sized for worst load scenario.

A control system can allow a building occupant to request a temporary change in the slat orientation to see something outside, dim the room, or other purpose. After a programmed time period, the system will resume energy generation mode. Such remote controls could operate similar to that of a garage door opener with RF or IR signals to minimize the wiring needed in the building. This mode would allow individual control over the window treatments at least temporarily to view outside depending on the slat orientation.

Powerskin Control Scheme Elements

Each one of the listed powerskin control elements, either alone or in combination with other elements, can be used to control one or more powerskins. For example, a room temperature signal, an inside thermostat setting signal and an outside light signal may be input to a controlling computer. The computer executes software that compares the inside thermostat setting with room temperature and controls the slat setting on the powerskin to harvest more heat from sunlight, if the outside light signal exceeds a threshold. In another embodiment, the control system detects the presence of people in building, an inside light signal and an outside light signal and then directs a powerskin to divert more light inside the building to increase the building light to a target value. In another embodiment, a signal that indicates presence or absence of people inside of building or room is input and the controlling computer adjusts a powerskin to permit less outside light from entering the building upon detection of people leaving. In another embodiment a powerskin is directed to allow less light in and more heat instead when an input room light signal indicates that the lights have been turned off.

Exemplary data input signals include: room temperature, outdoor temperature, Inside-outside temperature differential, inside light, outside light, inside-outside light differential, time of year (warm vs. cold season), time of year (stored or calculated sun elevation angle or other parameter), time of day (stored or calculated sun elevation angle, azimuth), inside thermostat setting versus other data, inside light switch(es) on, presence of people in building, room (vacation days etc), and relative or absolute need for hot water. Exemplary output effector signals from the powerskin controller include: slat angle control, slat closure control, electrical conversion control louver coolant pump flow, other pump and valve positions for the use of the heat by the building, intruder alarm based on shadows at night, substantially complete slat closure in one direction (reflective surface facing out) vs. opposite direction and non reflective or colored surface facing out.

In some embodiments, slat design may be optimized for a particular installation by taking into account local weather patterns, installation orientation (tilt and azimuth), any local obstructions, the overall slat length used, and whether entry of diffuse interior daylight exit of light through the collector is desired. The representative powerskin control input elements and output elements listed above exemplify some of the parameters, but a skilled artisan readily will appreciate further useful parameters.

Powerskin Night Use

While designed primarily for radiation conversion, embodiments include useful features for night use. A powerskin can provide increased insulation compared to that of a façade when used over conventional construction surfaces, via automatic slat closure at night. Such automated movement can be used as a convective barrier. An enclosed converter with an extra layer of glass or backing adds another convection and/or conductive barrier.

A powerskin can close reflective surface blinds at night to provide a reflective surface to the outside that minimizes nighttime lighting costs. In an embodiment the slats include one or more light emissive elements for further general external lighting or pattern creation such as advertising messages. A powerskin can provide security by automatically shielding from view the contents of a room from outside. In another embodiment, solar cell output from a converter at night is used to monitor the existence of or pattern of shadows that fall upon the side of a building and can be used for security purposes to alert the presence of unexpected or anomalous light patterns. In an embodiment, a controller compares patterns of shifting light activity to learn new patterns and also to learn patterns that indicate the approach of a person to a building. Concave "inside" slat surfaces can be painted in a wide variety of colors or patterns to provide aesthetics or advertising that may be used in daytime or at night. The installation cost of a converter substantially may be reduced when the device does not require anchoring to a building exterior and can more easily survive wind, rain and temperature extremes that such an installation requires.

In an embodiment, hot fluid is circulated to the slats at night to dissipate heat. This embodiment is particularly useful in desert regions that experience hot days and cool nights. In an embodiment, a temperature sensor will determine when a minimum temperature set point has been reached and then activate a pump to move warm fluid from inside the building into the slats to cool the fluid and return the fluid to the inside where heat may be absorbed, thereby cooling the building interior or cooling a thermal energy storage tank. In an embodiment, two separate fluid circuits are used, a hot circuit during the day whereby heat energy is brought in for heating water or other purposes. The same slat conduits may be fluidically switched over at night to allow warm air conditioning fluid to circulate to slats and release heat at night. In an embodiment, both circuits are closed loop systems, although in some environments where freezing is not a problem, plain water can be used for direct hot water heating during the day.

Other combinations of the inventive features described above, of course easily can be determined by a skilled artisan after having read this specification, and are included in the spirit and scope of the claimed invention. Documents cited herein specifically are incorporated in their entireties by reference. Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A radiant energy conversion apparatus, comprising:
    a converter housing comprising a front light transmissive cover and a rear cover, said converter housing defining a volume between said front light transmissive cover and said rear cover; and
    a radiant energy converter positioned within said converter housing volume, said radiant energy converter further comprising:
        a bulkhead frame fixedly mounted within said converter housing and defining an open bulkhead frame interior, and a plurality of fluid conduit mounts positioned on said bulkhead frame and opening into said bulkhead frame interior;
        a plurality of parallel louvers positioned within said bulkhead frame interior, each of said louvers comprising:
            a first side forming a concave, concentrating reflective lens configured to reflect light passing through said light transmissive cover onto a focused region on a second side of an adjacent louver, and a second side configured to receive at least one solar cell and to receive light reflected from a first side of an adjacent louver; and
            a fluid conduit attached to said second side and pivotably mounting the louver to a pair of said fluid conduit mounts while being in fluid communication with said fluid conduit mounts and so that a pivot axis of each of said louvers is immovably positioned a fixed distance from a pivot axis of each other louver; and
        an actuator movably mounted within said converter housing and engaging said louvers so as to rotate said louvers in unison upon movement of said actuator.

2. The apparatus of claim 1, wherein the concave, concentrating reflective lens is parabolic.

3. The apparatus of claim 1, wherein said louvers further comprise a plurality of features to provide assembly or mounting indexes, or encapsulation and sealing features for the solar cells.

4. The apparatus of claim 1, wherein the plurality of louvers are constructed primarily of aluminum.

5. The apparatus of claim 4, wherein said second side of said louver and said fluid conduit are constructed from a single piece of extruded aluminum.

6. The apparatus of claim 5, wherein said concave, concentrating reflective lens is parabolic.

7. The apparatus of claim 1, further comprising at least one solar cell coupled to one or more bypass diodes.

8. The apparatus of claim 1, wherein the fluid conduit extends beyond one end of said second side of said louver to form a first pivot section, and extends beyond another end of said second side of said louver to form a second pivot section.

9. The apparatus of claim 8, wherein the first and second pivot sections are coupled to o-ring seals.

10. The apparatus of claim 9, wherein each pivot section comprises 2 o-rings that provide a liquid seal and that act as a rotation bearing.

11. The apparatus of claim 1, further comprising a stepper motor engaging said actuator.

12. The apparatus of claim 1, further comprising solar cells coupled to said second side of said louver via an electrically non-conductive, thermally conductive adhesive.

13. The apparatus of claim 12, wherein the adhesive comprises a thermally conductive epoxy.

14. The apparatus of claim 11, wherein said stepper motor is configured to cause an adjustment to a position of said louvers.

15. The apparatus of claim 1, wherein a portion of said second side of said louver is substantially flat.

16. A radiant energy conversion system, comprising:
   a radiant energy converter comprising:
      a fixed bulkhead frame defining an open bulkhead frame interior, and a plurality of fluid conduit mounts positioned on said bulkhead frame and opening into said bulkhead frame interior;
      a plurality of louvers positioned within said bulkhead frame interior, each of said louvers further comprising:
         a first side forming a concave, concentrating reflective lens configured to reflect light onto a focused region on a second side of an adjacent louver, and a second side configured to receive at least one solar cell and to receive light reflected from a first side of an adjacent louver; and
         a fluid conduit attached to said second side and pivotably mounting the louver to a pair of said fluid conduit mounts while being in fluid communication with said fluid conduit mounts and so that a pivot axis of each of said louvers is immovably positioned a fixed distance from a pivot axis of each other louver; and
      an actuator movably mounted with respect to said fixed bulkhead frame and engaging said louvers so as to rotate said louvers in unison upon movement of said actuator;
   a controller coupled to said plurality of louvers, wherein said controller is configured to adjust a position of the plurality of louvers; and
   a storage device configured to store data corresponding to sun angle for a given time, wherein the controller is configured to cause adjustment to the position of the plurality of louvers based on the stored data.

17. The system of claim 16, further comprising a stepper motor coupled to the controller and the plurality of louvers, wherein the stepper motor is configured to cause adjustment to the position of the plurality of louvers.

18. The system of claim 16, wherein the controller further comprises a processor configured to process the stored data.

19. The apparatus of claim 1, further comprising solar cells on said second side of said louver.

* * * * *